(12) United States Patent
Berry, Jr. et al.

(10) Patent No.: US 7,953,510 B2
(45) Date of Patent: May 31, 2011

(54) SYSTEM AND METHOD FOR SEMICONDUCTOR IDENTIFICATION CHIP READ OUT

(75) Inventors: Robert Walter Berry, Jr., Round Rock, TX (US); Christopher R. Conley, Pflugerville, TX (US); Christopher J. Kuruts, Round Rock, TX (US); James P. Kuruts, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 929 days.

(21) Appl. No.: 11/855,000

(22) Filed: Sep. 13, 2007

(65) Prior Publication Data

US 2009/0076641 A1 Mar. 19, 2009

(51) Int. Cl.
*G06F 19/00* (2006.01)
(52) U.S. Cl. .......................... 700/116; 714/721
(58) Field of Classification Search .................. 700/116; 714/721
See application file for complete search history.

(56) References Cited

U.S. PATENT DOCUMENTS

| | | | | |
|---|---|---|---|---|
| 5,721,741 A | * | 2/1998 | Deas | 714/724 |
| 6,003,769 A | * | 12/1999 | Ebbing | 235/380 |
| 6,496,596 B1 | * | 12/2002 | Zika et al. | 382/149 |
| 6,530,045 B1 | * | 3/2003 | Cooper et al. | 714/719 |
| 7,557,596 B2 | * | 7/2009 | Eldridge et al. | 324/763 |
| 2002/0135391 A1 | * | 9/2002 | Rearick et al. | 324/765 |
| 2003/0219913 A1 | * | 11/2003 | Pourkeramati et al. | 438/12 |
| 2005/0225347 A1 | * | 10/2005 | Khandros et al. | 324/763 |
| 2007/0178612 A1 | * | 8/2007 | Bradl et al. | 438/14 |

OTHER PUBLICATIONS

"Modern Test Techniques: Tradeoffs, Synergies, and Scalable Benefits",—Volkerink et al, Agilent Laboratories, Nov. 8, 2002.*

* cited by examiner

*Primary Examiner* — Michael D Masinick
(74) *Attorney, Agent, or Firm* — VanLeeuwen & VanLeeuwen; Matthew B. Talpis

(57) ABSTRACT

A system and method for semiconductor identification chip read out is presented. A user uses a stand-alone handheld device to extract product data, which includes manufacturing process attributes, from a semiconductor device. The semiconductor device couples to the hand held device through a subset of pins, such as a power pin, a ground pin, a clock in pin, and a data out pin. When coupled, the handheld device provides a clock signal to the semiconductor device. In turn, on chip logic within the semiconductor device detects the clock signal and gathers internal product data. Once gathered, the on chip logic provides the product data to the hand held device through the data out pin for a user to view. As a result, the user may track semiconductor devices more efficiently.

17 Claims, 7 Drawing Sheets

SYSTEM AND METHOD FOR SEMICONDUCTOR IDENTIFICATION CHIP READ OUT

BACKGROUND OF THE INVENTION

1. Technical Field

The present invention relates to a system and method for semiconductor identification chip read out. More particularly, the present invention relates to a system and method for extracting product data from a semiconductor device, which includes manufacturing process data, using a stand-alone handheld data extractor device.

2. Description of the Related Art

Many semiconductor devices internally store product data that identify manufacturing process attributes particular to the semiconductor devices, such as vendor identifiers, wafer lot numbers, fabrication locations, etc. This information is valuable in order for users to track the semiconductor devices.

A challenge found is that the semiconductor devices must have full contact to a system board, along with some type of power-on sequence, in order to enable the semiconductor devices before the semiconductor devices provide the internal product data. In many cases, a user develops a complete system in order to read the product data out of the semiconductor devices.

What is needed, therefore, is a system and method for easily and efficiently obtaining a semiconductor device's internal product data without connecting the semiconductor device to a complete system board.

SUMMARY

It has been discovered that the aforementioned challenges are resolved using a system and method for using a stand-alone handheld device to extract product data from a semiconductor device using a subset of semiconductor device pins. A user uses a data extractor to extract product data, which includes manufacturing process attributes, from the semiconductor device without having to connect the semiconductor device to a full system board. As a result, the user may track semiconductor devices more efficiently.

The user inserts a semiconductor device onto the data extractor's socket that, in turn, couples conductive contacts to a subset of the semiconductor device's pins, such as a power pin, a ground pin, a clock pin, and a data out pin. Once the semiconductor device couples to the socket, the user depresses a power button to turn on the data extractor. The data extractor checks its battery condition, detects the semiconductor device, and informs the user that it is ready to extract data by displaying a message on a display.

Next, the user depresses a "Read" button, which triggers the data extractor to provide a clock signal to the semiconductor device. The semiconductor device includes on chip logic that detects the clock signal and gathers product data from within the semiconductor device. Subsequently the on chip logic provides the product data to the data extractor through a data out pin, which the data extractor displays for the user to view. In addition, the user may download the product data through an external port to a data analysis system for later storage and/or analysis.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
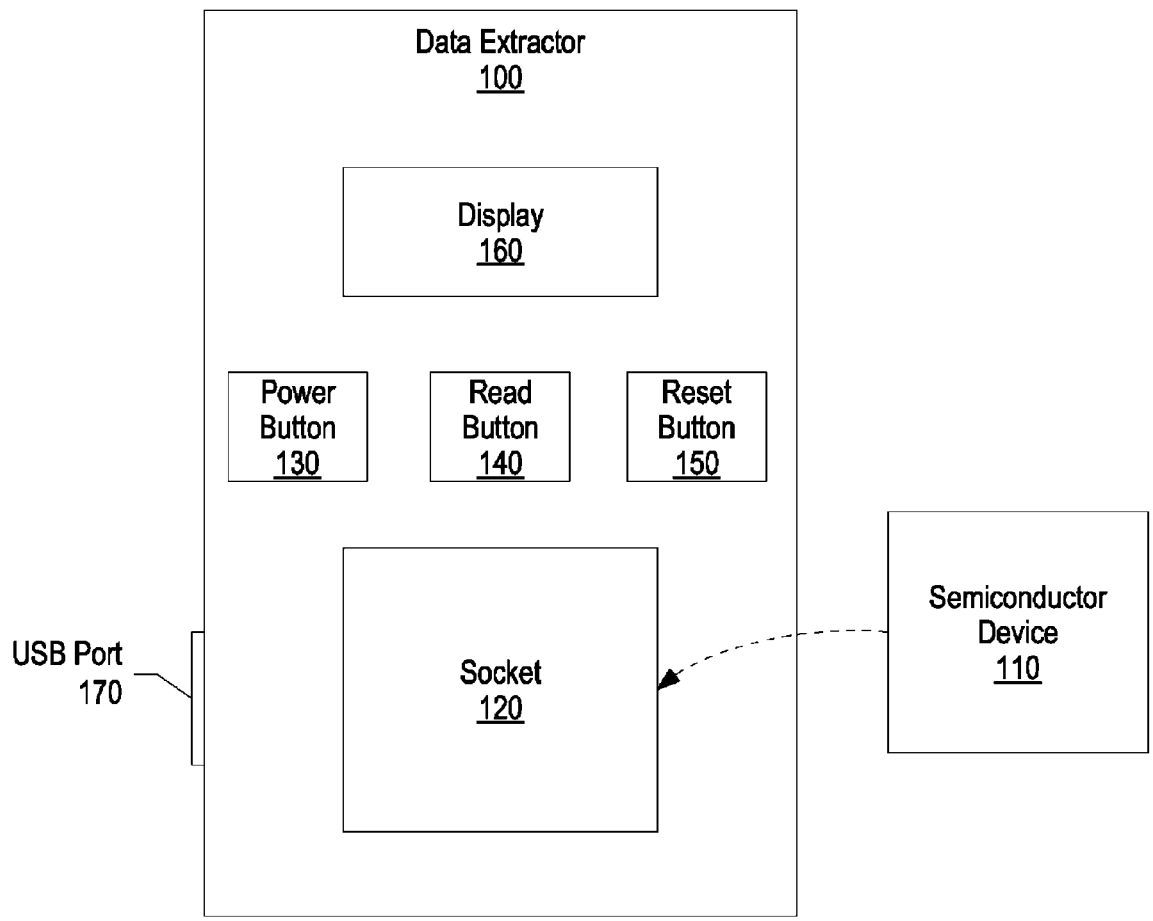
FIG. 1 is a diagram showing a data extractor that extracts product data from a semiconductor device using a subset of pins included on the semiconductor device.

FIG. 1 is a diagram showing a data extractor that extracts product data from a semiconductor device using a subset of pins included on the semiconductor device. A user uses data extractor 100 to extract product data, which includes manufacturing process attributes, from semiconductor device 110 without having to connect semiconductor device 110 to a full system board. As a result, the user may track semiconductor devices more efficiently.

Figure 2:
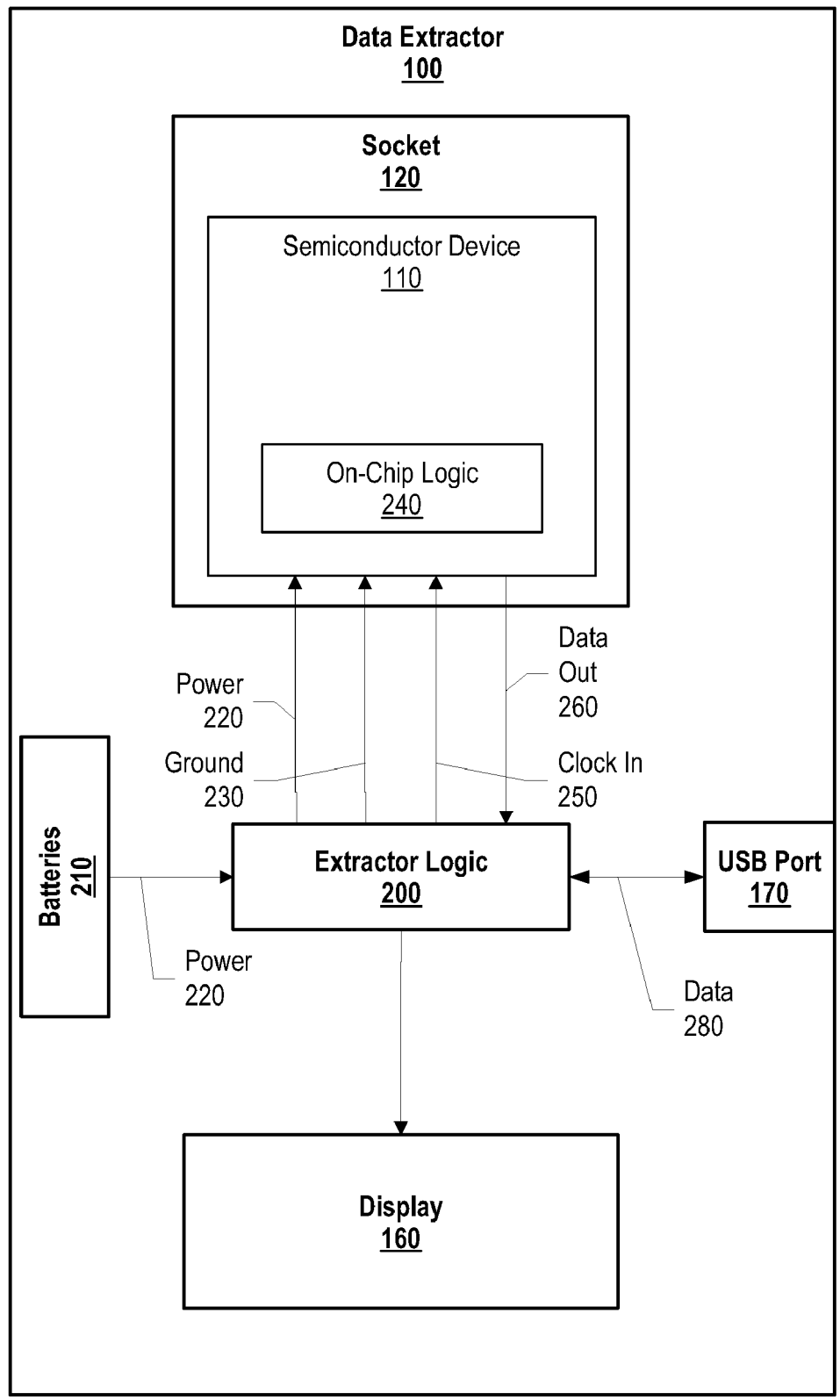
FIG. 2 is a diagram showing a data extractor's major components.
Figure 3:
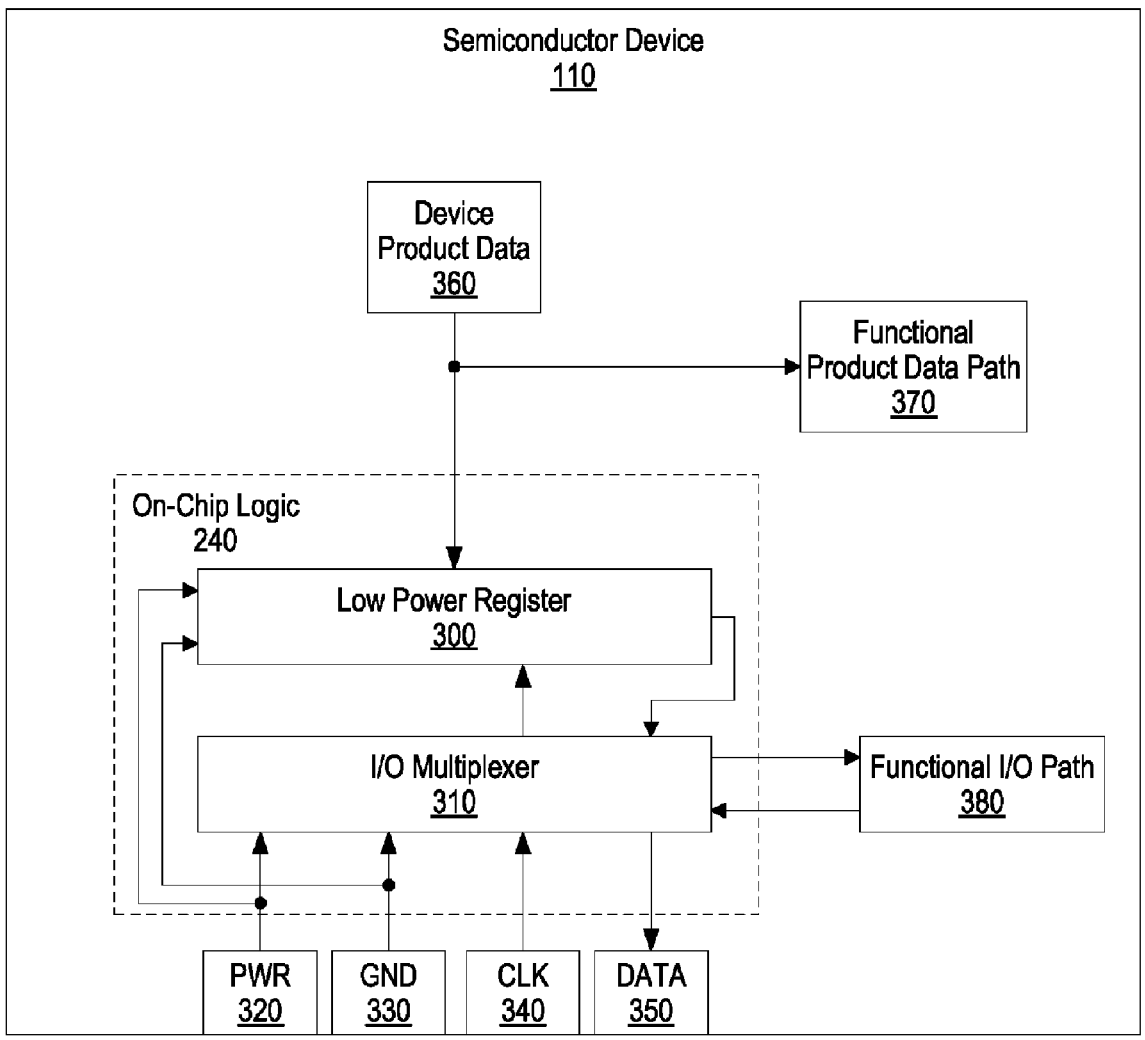
FIG. 3 is a diagram showing a semiconductor device's on chip logic gathering product data and providing the product data after detecting a clock signal from a data extractor.

The user inserts semiconductor device 110 onto socket 120, which couples semiconductor device 110 to data extractor 100 through a subset of pins included on semiconductor device 110, such as a power pin, a ground pin, a clock pin, and a data out pin (see FIGS. 2, 3, and corresponding text for further details). Once semiconductor device 110 couples to socket 120, the user depresses button 130 to turn on data extractor 100. Data extractor 100 checks its battery condition, detects semiconductor device 110, and informs the user that it is ready to extract data by displaying a message on display 160 (see FIG. 5 and corresponding text for further details).

In turn, the user depresses button 140 and data extractor 100 provides a clock signal to semiconductor device 110. On chip logic included in semiconductor device 110 detects the clock signal and gathers the product data from within semiconductor device 110, and subsequently provides the product data to data extractor 100 through a data out pin (see FIGS. 2, 3, and corresponding text for further details).

Data extractor 100 displays the product data on display 160 for the user to view. In addition, the user may download the product data through port 170 to a data analysis system for later storage and/or analysis. At any time, the user may reset data extractor 100 by depressing button 150.

FIG. 2 is a diagram showing a data extractor's major components. Data extractor 100 includes socket 120, extractor logic 200, batteries 210, display 160, and Universal Serial Bus (USB) port 170. When semiconductor device 110 couples to socket 120 and a user depresses a "Power" button, extractor logic 200 verifies power 220's voltage level and provides power 220 and ground 230 to semiconductor device 110. In addition, extractor logic 200 provides a "Device Detected" message on display 160.

Next, when the user depresses a "Read" button, extractor logic 200 provides clock in 250 to semiconductor device 110, which invokes on-chip logic 240 to gather product data from within semiconductor device 110. Once gathered, on-chip logic 240 provides the product data to extractor logic 200 through data out 260. In turn, extractor logic 200 displays the product data on display 160 (see FIG. 4 and corresponding text for further details). In addition, extractor logic may download the product data to a data analysis tool through USB port 170.

FIG. 3 is a diagram showing a semiconductor device's on chip logic gathering product data and providing the product data after detecting a clock signal from a data extractor.

Semiconductor device 110 includes on-chip logic 240, which receives power and clock signals from a data extractor, such as data extractor 100 shown in FIG. 1.

During normal operation, Input/Output (I/O) multiplexer 310 receives power internally and passes data to/from functional I/O path 380 as well as data pin 350. In addition, during normal operation, device product data 360 passes to functional product data path 370, which connects to other parts of semiconductor device 110.

However, when semiconductor device 110 is not connected to a system, but rather connected to a data extractor that applies power to power pin 320, I/O multiplexer 310 switches configuration and provides a clock signal from clock pin 340 to low power register 300. In turn, low power register 300 gathers device product data 360 and provides the product data on data out pin 350 through I/O multiplexer 300.

Figure 4:
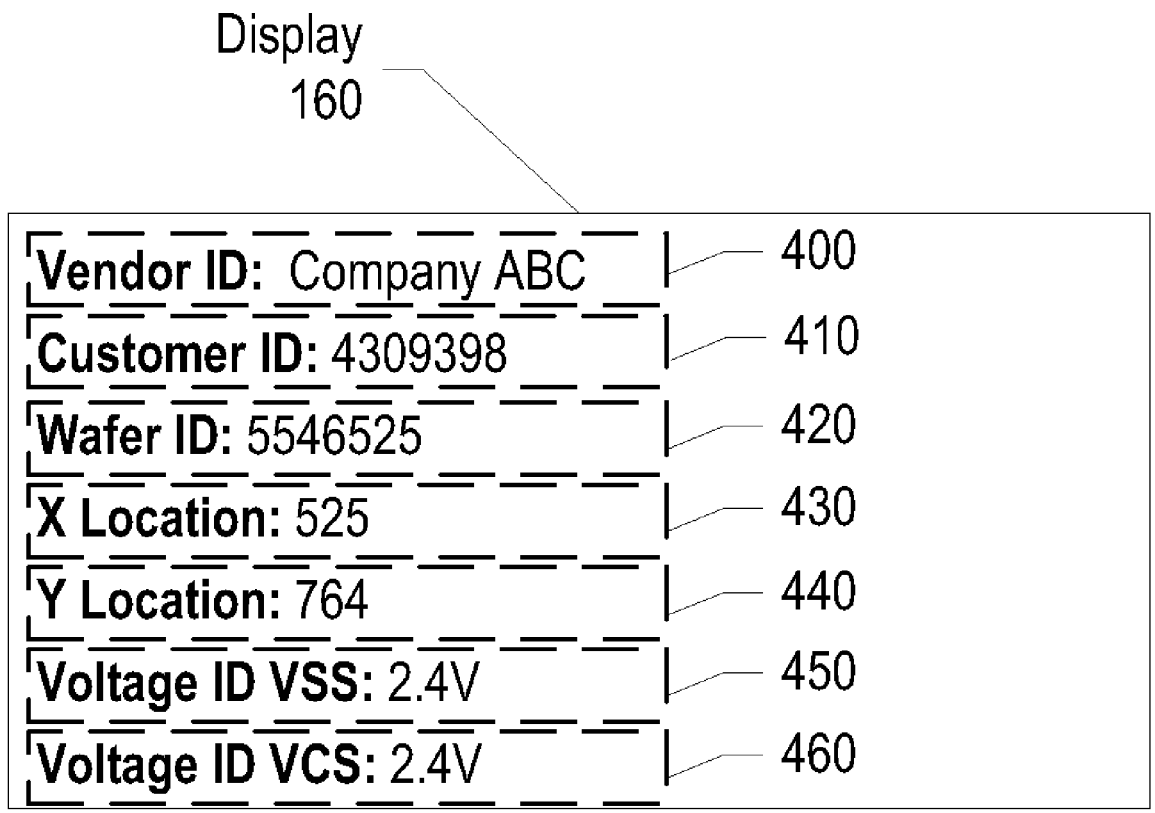
FIG. 4 is a diagram showing product data displayed on a data extractor's display that was extracted from a semiconductor device.

FIG. 4 is a diagram showing product data displayed on a data extractor's display that was extracted from a semiconductor device. Display 160, which is the same as that shown in FIG. 1, displays lines 400 through 460 for a user to view. Lines 400-440 include manufacturing process attributes, while lines 450-460 include device attributes. Line 400 includes a vendor identifier that indicates the vendor that manufactured the semiconductor device. Line 410 includes a customer identifier that indicates a target customer.

Line 420 includes a wafer identifier that indicates a wafer lot number for the silicon material included in the semiconductor device. Line 430 and 440 include X and Y die coordinates on the particular wafer corresponding to the location of the silicon material included in the semiconductor device. And, lines 450 and 460 are voltage indicators that indicate a voltage to operate the semiconductor device, which a customer may use to set power supplies. As one skilled in the art can appreciate, more, less, or different product data may be displayed on a data extractor's display other than what is shown in FIG. 4.

Figure 5:
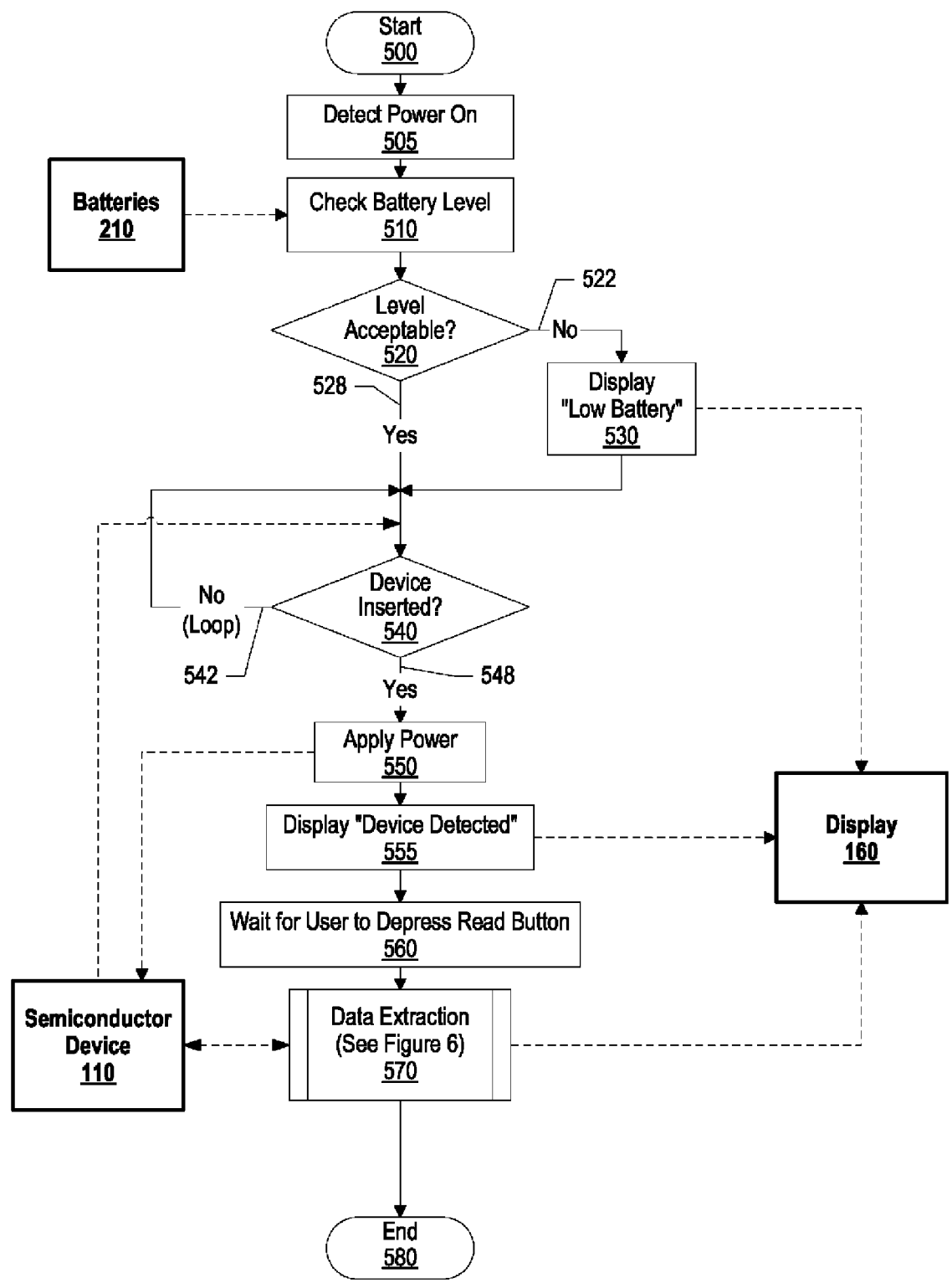
FIG. 5 is a high-level flowchart showing steps taken in detecting a semiconductor device inserted on a data extractor and extracting product data from the semiconductor device.

FIG. 5 is a high-level flowchart showing steps taken in detecting a semiconductor device inserted on a data extractor and extracting product data from the semiconductor device.

Processing commences at 500, whereupon processing detects a user depressing a power button (step 505). At step 510, processing checks a voltage level of batteries 210, and a determination is made as to whether the voltage level is acceptable (decision 520). For example, processing may require the batteries 210's voltage level to be greater than 2.0 volts. Batteries 210 are the same as that shown in FIG. 2.

If the voltage level is not acceptable, decision 520 branches to "No" branch 522, whereupon processing displays a "Low Battery" message on display 160, informing a user to replace batteries 210. On the other hand, if the battery level is acceptable, decision 520 branches to "Yes" branch 528, whereupon a determination is made as to whether a semiconductor device 110 is inserted into the data extractor's socket, such as socket 120 shown in FIG. 1. Display 160 and semiconductor device 110 are the same as that shown in FIG. 1.

If semiconductor device 110 is not inserted, processing branches to "No" branch 542, which loops back to wait for a user to insert semiconductor device 110. This looping until the user inserts semiconductor device 110, at which point decision 540 branches to "Yes" branch 548 whereupon processing applies power to semiconductor device 110 at step 550. As one skilled in the art can appreciate, processing may comprise a timeout period that turns off after a particular amount of time if the user does not insert semiconductor device 110 into the socket.

At step 555, processing displays "Device Detected" on display 160, and waits for the user to depress a "Read" button (step 560). Once the user depresses the "Read" button, processing applies a clock to semiconductor device 110, reads product data out of semiconductor device 110, and displays the product data on display 160 (pre-defined process block 570, see FIG. 6 and corresponding text for further details). Processing ends at 580.

Figure 6:
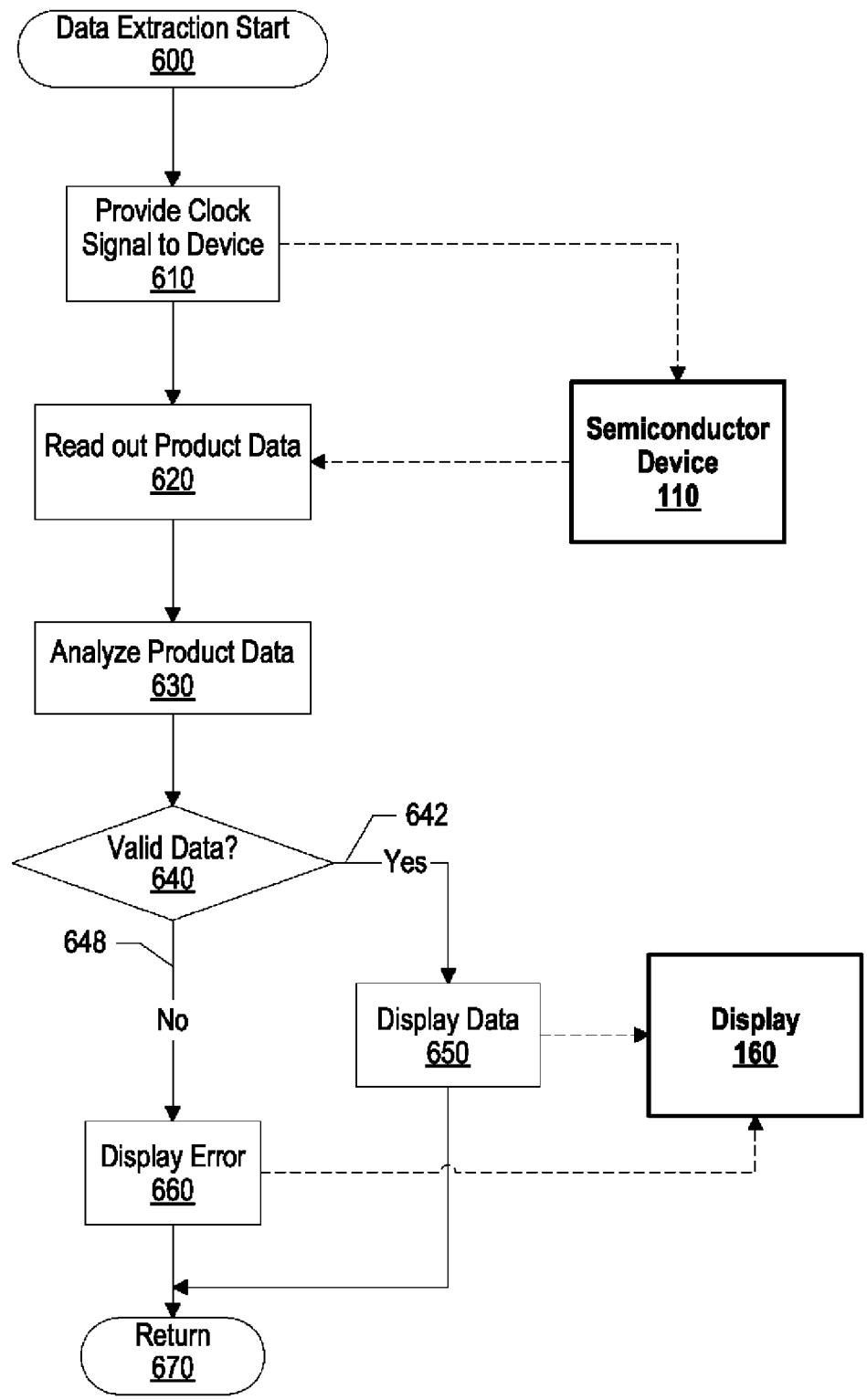
FIG. 6 is a flowchart showing steps taken in extracting product data from a semiconductor device.

FIG. 6 is a flowchart showing steps taken in extracting product data from a semiconductor device. Data extraction commences at 600, whereupon processing provides a clock signal to semiconductor device 110 at step 610. Semiconductor device 110 detects the clock signal and gathers product data located within semiconductor device. In turn, processing reads out the product data from semiconductor device 110 at step 620. Semiconductor device 110 is the same as that shown in FIG. 1.

Processing analyzes the product data at step 630 to ensure that the product data is the correct form factor, such as by using a decode algorithm, and a determination is made as to whether the data is valid (decision 640). If the data is valid, decision 640 branches to "Yes" branch 642 whereupon processing displays the product data on display 160 at step 650 (see FIG. 4 and corresponding text for further details). On the other hand, if the product data is not valid, decision 640 branches to "No" branch 648 whereupon processing displays an error message on display 160 (step 660). Display 160 is the same as that shown in FIG. 1. Processing returns at 670.

Figure 7:
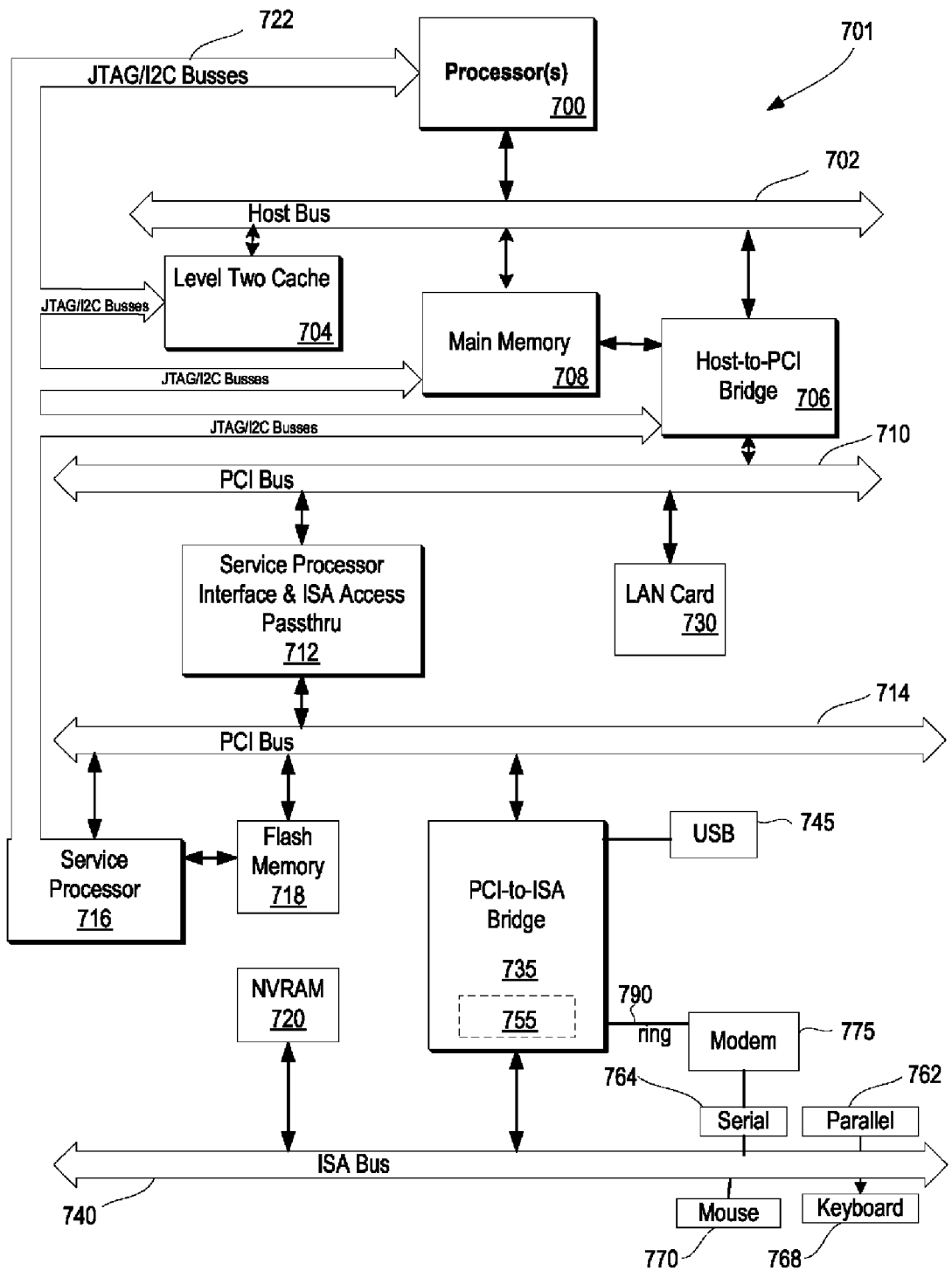
FIG. 7 is a block diagram of a computing device capable of implementing the present invention.

FIG. 7 illustrates information handling system 701 which is a simplified example of a computer system capable of performing the computing operations described herein. Computer system 701 includes processor 700 which is coupled to host bus 702. A level two (L2) cache memory 704 is also coupled to host bus 702. Host-to-PCI bridge 706 is coupled to main memory 708, includes cache memory and main memory control functions, and provides bus control to handle transfers among PCI bus 710, processor 700, L2 cache 704, main memory 708, and host bus 702. Main memory 708 is coupled to Host-to-PCI bridge 706 as well as host bus 702. Devices used solely by host processor(s) 700, such as LAN card 730, are coupled to PCI bus 710. Service Processor Interface and ISA Access Pass-through 712 provides an interface between PCI bus 710 and PCI bus 714. In this manner, PCI bus 714 is insulated from PCI bus 710. Devices, such as flash memory 718, are coupled to PCI bus 714. In one implementation, flash memory 718 includes BIOS code that incorporates the necessary processor executable code for a variety of low-level system functions and system boot functions.

PCI bus 714 provides an interface for a variety of devices that are shared by host processor(s) 700 and Service Processor 716 including, for example, flash memory 718. PCI-to-ISA bridge 735 provides bus control to handle transfers between PCI bus 714 and ISA bus 740, universal serial bus (USB) functionality 745, power management functionality 755, and can include other functional elements not shown, such as a real-time clock (RTC), DMA control, interrupt support, and system management bus support. Nonvolatile RAM 720 is attached to ISA Bus 740. Service Processor 716 includes JTAG and I2C busses 722 for communication with processor(s) 700 during initialization steps. JTAG/I2C busses 722 are also coupled to L2 cache 704, Host-to-PCI bridge 706, and main memory 708 providing a communications path between the processor, the Service Processor, the L2 cache, the Host-to-PCI bridge, and the main memory. Service Processor 716 also has access to system power resources for powering down information handling device 701.

Peripheral devices and input/output (I/O) devices can be attached to various interfaces (e.g., parallel interface 762, serial interface 764, keyboard interface 768, and mouse interface 770 coupled to ISA bus 740. Alternatively, many I/O devices can be accommodated by a super I/O controller (not shown) attached to ISA bus 740.

In order to attach computer system 701 to another computer system to copy files over a network, LAN card 730 is coupled to PCI bus 710. Similarly, to connect computer system 701 to an ISP to connect to the Internet using a telephone line connection, modem 775 is connected to serial port 764 and PCI-to-ISA Bridge 735.

While FIG. 7 shows one information handling system that employs processor(s) 700, the information handling system may take many forms. For example, information handling system 701 may take the form of a desktop, server, portable, laptop, notebook, or other form factor computer or data processing system. Information handling system 701 may also take other form factors such as a personal digital assistant (PDA), a gaming device, ATM machine, a portable telephone device, a communication device or other devices that include a processor and memory.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method comprising:
   coupling a semiconductor device only to a data extractor through a subset of pins located on the semiconductor device;
   in response to the coupling, applying power from the data extractor to the semiconductor device, wherein the application of power turns on only a portion of the semiconductor device, which allows the semiconductor device to only provide manufacturing data through the subset of pins, wherein the manufacturing data identifies manufacturing process attributes of the semiconductor device; and
   extracting the manufacturing data from the semiconductor device using the data extractor.

2. The method of claim 1 wherein the manufacturing process attributes are selected from the group consisting of a wafer identifier, a die coordinate, and a vendor identifier.

3. The method of claim 2 wherein the semiconductor device includes a silicon die, and wherein the die coordinate indicates a location of the silicon die on a corresponding wafer prior to being inserted in the semiconductor device.

4. The method of claim 1 wherein the semiconductor device includes on chip logic that provides the manufacturing data to the data extractor after detecting a clock signal from the data extractor.

5. The method of claim 1 wherein the subset of pins are only a power pin, a ground pin, a clock pin, and a data out pin.

6. The method of claim 1 wherein the data extractor is a stand-alone handheld device that is battery operated, the method further comprising:
   displaying the manufacturing data on a display included on the data extractor.

7. A computer program product stored on a computer operable media, the computer operable media containing instructions for execution by a computer, which, when executed by the computer, cause the computer to implement a method of extracting product data, the method comprising:
   in response to the coupling, applying power from the data extractor to the semiconductor device, wherein the application of power turns on only a portion of the semiconductor device, which allows the semiconductor device to only provide manufacturing data through the subset of pins, wherein the manufacturing data identifies manufacturing process attributes of the semiconductor device; and
   extracting the manufacturing data from the semiconductor device using the data extractor.

8. The computer program product of claim 7 wherein the manufacturing process attributes are selected from the group consisting of a wafer identifier, a die coordinate, and a vendor identifier.

9. The computer program product of claim 8 wherein the semiconductor device includes a silicon die, and wherein the die coordinate indicates a location of the silicon die on a corresponding wafer prior to being inserted in the semiconductor device.

10. The computer program product of claim 7 wherein the semiconductor device includes on chip logic that provides the manufacturing data to the data extractor after detecting a clock signal from the data extractor.

11. The computer program product of claim 7 wherein the subset of pins are only a power pin, a ground pin, a clock pin, and a data out pin.

12. The computer program product of claim 7 wherein the data extractor is a stand-alone handheld device that is battery operated, the method further comprising:
displaying the manufacturing data on a display included on the data extractor.

13. An apparatus comprising:
a data extractor that couples to a semiconductor device only through a subset of pins located on the semiconductor device;
wherein the data extractor is adapted to apply power to the semiconductor device that turns on only a portion of the semiconductor device, which allows the semiconductor device to only provide manufacturing data through the subset of pins, wherein the manufacturing data identifies manufacturing process attributes of the semiconductor device; and
wherein the data extractor is adapted to extract the manufacturing data from the semiconductor device.

14. The apparatus of claim 13 wherein the manufacturing process attributes are selected from the group consisting of a wafer identifier, a die coordinate, and a vendor identifier.

15. The apparatus of claim 14 wherein the semiconductor device includes a silicon die, and wherein the die coordinate indicates a location of the silicon die on a corresponding wafer prior to being inserted in the semiconductor device.

16. The apparatus of claim 13 wherein the semiconductor device includes on chip logic that provides the manufacturing data to the data extractor after detecting a clock signal from the data extractor.

17. The apparatus of claim 13 wherein the subset of pins are only a power pin, a ground pin, a clock pin, and a data out pin.

* * * * *